United States Patent
Kim et al.

(10) Patent No.: US 10,374,082 B2
(45) Date of Patent: Aug. 6, 2019

(54) SEMICONDUCTOR DEVICE

(71) Applicant: Samsung Electronics Co., Ltd., Suwon-si, Gyeonggi-do (KR)

(72) Inventors: Yong Don Kim, Suwon-si (KR); In Jun Hwang, Hwaseong-si (KR); Jung Han Kang, Busan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/629,308

(22) Filed: Jun. 21, 2017

(65) Prior Publication Data

US 2018/0006149 A1    Jan. 4, 2018

(30) Foreign Application Priority Data

Jun. 29, 2016 (KR) ........................ 10-2016-0081317

(51) Int. Cl.
| | |
|---|---|
| *H01L 29/06* | (2006.01) |
| *H01L 29/08* | (2006.01) |
| *H01L 29/10* | (2006.01) |
| *H01L 29/36* | (2006.01) |
| *H01L 29/66* | (2006.01) |
| *H01L 29/78* | (2006.01) |
| *H01L 21/761* | (2006.01) |

(52) U.S. Cl.
CPC ........ *H01L 29/7816* (2013.01); *H01L 21/761* (2013.01); *H01L 29/0649* (2013.01); *H01L 29/086* (2013.01); *H01L 29/0878* (2013.01); *H01L 29/0882* (2013.01); *H01L 29/1095* (2013.01); *H01L 29/36* (2013.01); *H01L 29/66689* (2013.01); *H01L 29/0653* (2013.01); *H01L 29/1083* (2013.01); *H01L 29/1087* (2013.01)

(58) Field of Classification Search
CPC . H01L 29/7816; H01L 29/36; H01L 29/1095; H01L 29/0878
See application file for complete search history.

(56) References Cited

U.S. PATENT DOCUMENTS

| | | | |
|---|---|---|---|
| 4,345,265 | A | 8/1982 | Blanchard |
| 4,811,065 | A | 3/1989 | Cogan |
| 4,888,505 | A | 12/1989 | Skovmand |

(Continued)

FOREIGN PATENT DOCUMENTS

| | | |
|---|---|---|
| EP | 0 726 654 A1 | 8/1996 |
| EP | 1 220 323 A2 | 7/2002 |

(Continued)

*Primary Examiner* — Changhyun Yi
(74) *Attorney, Agent, or Firm* — Myers Bigel, P.A.

(57) ABSTRACT

A semiconductor device includes a substrate of a first conductivity type, a gate electrode on the substrate, a first high concentration impurity region of the first conductivity type that is disposed on a first side of the gate electrode, a first well of the first conductivity type that is disposed under the first high concentration impurity region and surrounds the first high concentration impurity region, a second well of a second conductivity type that overlaps with a portion of the gate electrode and is adjacent to the first well, and a first deep well of the second conductivity type that is disposed under the first well and the second well, the first deep well and the first high concentration impurity region being responsive to a first voltage.

9 Claims, 14 Drawing Sheets

(56) References Cited

U.S. PATENT DOCUMENTS

| | | |
|---|---|---|
| 4,896,196 A | 1/1990 | Blanchard et al. |
| 5,395,776 A | 3/1995 | Shibib |
| 5,495,123 A | 2/1996 | Canclini |
| 5,723,996 A | 3/1998 | Zojer |
| 5,886,487 A | 3/1999 | Khayat et al. |
| 6,153,473 A | 11/2000 | Calafut et al. |
| 6,169,309 B1 | 1/2001 | Teggatz et al. |
| 6,281,549 B1 | 8/2001 | Davies |
| 6,765,247 B2 | 7/2004 | Beasom |
| 6,784,489 B1 | 8/2004 | Menegoli |
| 6,890,804 B1 | 5/2005 | Shibib et al. |
| 6,902,967 B2 | 6/2005 | Beasom |
| 6,924,531 B2 | 8/2005 | Chen et al. |
| 6,958,515 B2 | 10/2005 | Hower et al. |
| 7,190,030 B1 | 3/2007 | Cheng et al. |
| 7,268,045 B2 | 9/2007 | Hower et al. |
| 7,420,260 B2 | 9/2008 | Kwon et al. |
| 7,470,955 B2 | 12/2008 | Glenn et al. |
| 7,535,057 B2 | 5/2009 | Yang |
| 7,804,670 B2 | 9/2010 | Reynders et al. |
| 8,258,752 B2 | 9/2012 | Chiu et al. |
| 8,415,219 B2 | 4/2013 | Hirler et al. |
| 8,455,340 B2 | 6/2013 | Zuniga et al. |
| 8,686,531 B2 | 4/2014 | Kim et al. |
| 8,878,275 B2 | 11/2014 | Kim et al. |
| 8,916,931 B2 | 12/2014 | Takeda et al. |
| 8,921,173 B2 | 12/2014 | Levin et al. |
| 8,933,492 B2 | 1/2015 | Kurjanowicz |
| 9,048,132 B2 | 6/2015 | Ko |
| 9,076,837 B2 | 7/2015 | Lin et al. |
| 9,190,408 B2 | 11/2015 | Mallikarjunaswamy |
| 2004/0041172 A1 | 3/2004 | Hirler et al. |
| 2005/0056907 A1 | 3/2005 | Maeda |
| 2007/0045767 A1* | 3/2007 | Zhu ............... H01L 23/3677 257/505 |
| 2007/0069288 A1 | 3/2007 | Takeda |
| 2009/0159968 A1 | 6/2009 | Merchant et al. |
| 2014/0001545 A1* | 1/2014 | Yang ............ H01L 29/66689 257/337 |

FOREIGN PATENT DOCUMENTS

| | | |
|---|---|---|
| EP | 1 436 846 A2 | 7/2004 |
| EP | 1 834 359 A1 | 9/2007 |
| JP | 2012-033841 A | 2/2012 |

* cited by examiner

SEMICONDUCTOR DEVICE

CROSS-REFERENCE TO RELATED APPLICATION

This application claims priority from Korean Patent Application No. 10-2016-0081317 filed on Jun. 29, 2016 in the Korean Intellectual Property Office, and all the benefits accruing therefrom under 35 U.S.C. 119, the contents of which are hereby incorporated herein by reference in its entirety.

FIELD

The present disclosure relates to semiconductor devices, and, more particularly, to semiconductor devices used in switching devices.

BACKGROUND

A generally used MOS field effect transistor (MOSFET) may provide advantages in that the electrical power gains are greater compared to a bipolar transistor, a gate driving circuit is relatively simple, and there is no time delay resulting from the storage or the recombination of the minority carriers during a turn-off operation. Accordingly, the MOSFET is widely used as a control, logical, and electrical power switch.

Further, the double diffused MOSFET (DEMOS) using double diffusion technology, such as a lateral DEMOS transistor (LDMOS), is widely used as an electrical power MOS transistor.

SUMMARY

A semiconductor device may be provided, which can enhance the efficiency of a battery, by preventing operation of a parasitic bipolar junction transistor (BJT) of an internal region of a power switch device.

According to an aspect of the present inventive concept, there is provided a semiconductor device comprising a substrate of a first conductivity type; a gate electrode on the substrate; a first high concentration impurity region of the first conductivity type that is disposed on a first side of the gate electrode; a first well of the first conductivity type that is disposed under the first high concentration impurity region and surrounds the first high concentration impurity region; a second well of a second conductivity type that overlaps with a portion of the gate electrode and is adjacent to the first well; and a first deep well of the second conductivity type that is disposed under the first well and the second well, the first deep well and the first high concentration impurity region being responsive to a first voltage.

According to another aspect of the present inventive concept, there is provided a semiconductor device comprising a substrate of a first conductivity type; a gate electrode on the substrate; a first high concentration impurity region of the first conductivity type that is disposed on a first side of the gate electrode; a first well of the first conductivity type that is disposed under the first high concentration impurity region and surrounds the first high concentration impurity region; a second high concentration impurity region of a second conductivity type that is disposed on a second side of the gate electrode; a second well of the second conductivity type that is disposed under the second high concentration impurity region and surrounds the second high concentration impurity region; a first deep well of the first conductivity type that is disposed under the second well; and a second deep well of the second conductivity type that is disposed across the first well and the second well under the first deep well, with the second deep well and the first high concentration impurity region being responsive to a first voltage.

According to still another aspect of the present inventive concept, there is provided a semiconductor device comprising a substrate of a second conductivity type including a first deep well of a first conductivity type and a second deep well of second conductivity type on the first deep well; and a transistor formed on the substrate and including a gate electrode, a first terminal responsive to a first voltage, and a second terminal responsive to a second voltage different from the first voltage, wherein the first deep well is responsive to the first voltage.

According to still another aspect of the present inventive concept, there is provided a semiconductor device comprising a substrate of a first conductivity type, a deep well on the substrate, a high voltage well on the deep well, a pick-up region on the deep well, and a drift region on the high voltage well. The high voltage well is between deep well and the drift region, but is not between the deep well and the pick-up region.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE DRAWINGS

The above and other aspects, features and advantages of the present disclosure will become more apparent to those of ordinary skill in the art by describing in detail exemplary embodiments thereof with reference to the accompanying drawings, in which.

DETAILED DESCRIPTION

Hereinbelow, a semiconductor device according to some exemplary embodiments of the inventive concept will be described with reference to FIGS. 1 to 3.

Figure 1:
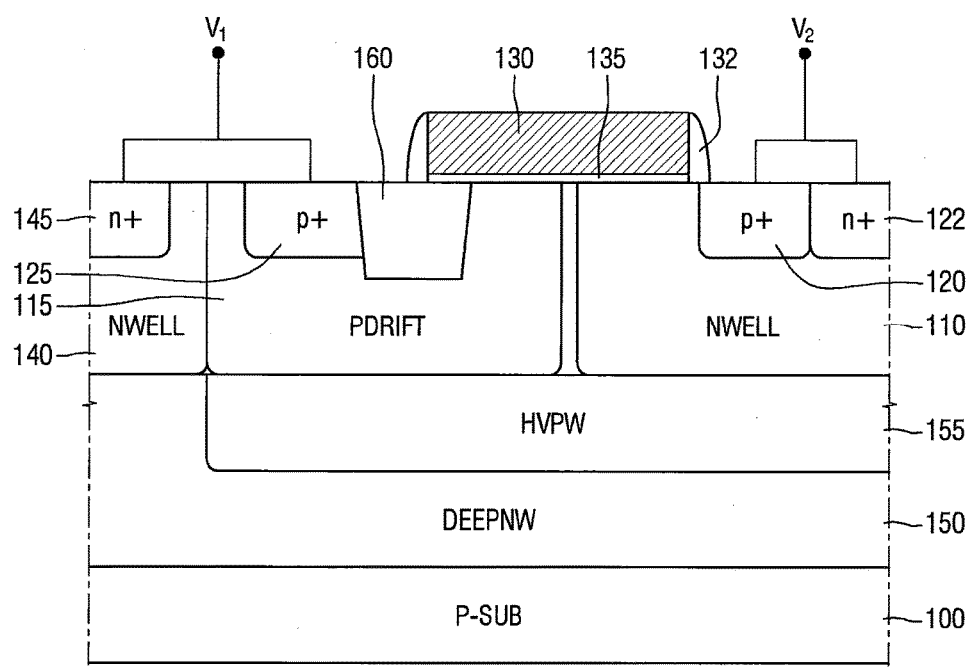
FIG. 1 is a cross-section view of a semiconductor device according to some embodiments of the inventive concept.

FIG. 1 is a cross-section view of a semiconductor device according to some exemplary embodiments of the inventive concept. FIG. 2 is a circuit diagram that may include a semiconductor device of FIG. 1 according to some embodiments of the inventive concept; and FIG. 3 is a cross-section view of an internal equivalent circuit of the semiconductor device of FIG. 1 according to some embodiments of the inventive concept.

Referring to FIG. 1, the semiconductor device according to some exemplary embodiments may include a gate electrode 130, a source region 120, a drain region 125, a body contact region 122, a body region 110, a drift region 115, a high voltage well 155, a deep well 150, and a pick-up contact region 145.

The substrate 100 may include a base substrate and an epitaxial layer grown on the base substrate, but embodiments of the inventive concept are not limited thereto.

The substrate 100 may include the base substrate only, i.e., it may not include the epitaxial layer. The substrate 100 may comprise one or more of a silicon semiconductor substrate, a gallium arsenide semiconductor substrate, a silicon germanium semiconductor substrate, a ceramic semiconductor substrate, a quartz semiconductor substrate, or a glass semiconductor substrate for a display.

Various embodiments are described hereafter by way of example in which the substrate 100 is a silicon semiconductor substrate. Further, the silicon semiconductor substrate may be of a first conductivity type (e.g., p-type), for example.

A device isolating region 160 may be separated when the gate electrode 130 is spaced apart from the drain region 125, which will be described below.

The device isolating region 160 may reduce or prevent the deterioration of the reliability in the semiconductor device due to a high electrical field formed between the drain region 125 and an edge of the gate electrode 130 adjacent to the drain region 125 when a high voltage is applied to the drain region 125. The device isolating region 160 may enhance the break-down voltage of the semiconductor device.

The device isolating region 160 may be formed as a shallow trench isolation (STI) region, for example, but embodiments of the inventive concept are not limited thereto. It may also be formed as a local oxidation of silicon (LOCOS) region, for example, in other embodiments.

The gate electrode 130 may be formed on the substrate 100. The gate electrode 130 may be formed across the drift region 115 and the body region 110.

A portion of the gate electrode 130 may overlap with the drift region 115, and another portion of the gate electrode 130 may overlap with the body region 110.

A portion of the gate electrode 130 overlapping with the drift region 115 may overlap with a portion of the device isolating region 160. The gate electrode 130 may extend along a portion of an upper surface of the device isolating region 160.

The gate electrode 130 may include at least one of, for example, polycrystalline silicon (poly Si), amorphous silicon (a-Si), titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

When the gate electrode 130 includes silicon in the upper surface thereof, the gate electrode 130 may include a metal silicide film formed on the upper surface of the gate electrode 130.

A gate insulating film 135 may be disposed on the gate electrode 130 and the substrate 100. The gate insulating film 135 may electrically isolate the gate electrode 130 and the substrate 100.

The gate insulating film 135 may be, for example, a silicon oxide film, a silicon nitride film, a silicon oxynitride film, GexOyNz, GexSiyOz, a high-k dielectric film, combinations thereof or a stack film in which these are sequentially stacked. For example, the high-k dielectric film may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but embodiments of the inventive concept are not limited thereto.

A gate spacer 132 may be formed on a sidewall of the gate electrode 130. For example, the gate spacer 132 may include at least one of silicon nitride (SiN), silicon oxynitride (SiON), silicon oxide ($SiO_2$), silicon oxycarbonitride (SiOCN), silicon carbonitride (SiCN), and combinations thereof.

Although FIG. 1 illustrates that the gate spacer 132 is a single layer, it is not limited thereto and may be formed as a multi layer.

Referring to FIG. 1, the semiconductor device in which the gate electrode 130 is used as a gate may be, for example, a first conductivity type transistor, i.e., a p-type transistor.

The source region 120 may be disposed on one side of the gate electrode 130. The source region 120 may be, for example, a high concentration impurity region of a first conductivity type.

The source region 120 may be formed within the substrate 100. Further, unlike the illustration, the source region 120 may be a raised source region.

A metal silicide film may be formed on the upper surface of the source region 120 to reduce the resistance between the source region 120 and a contact that applies the source voltage to the source region 120.

The body region 110 may be formed on one side of the gate electrode 130. The body region 110 may be formed under the source region 120 to surround the source region 120.

The body region 110 may be formed within the substrate 100. The body region 110 may overlap with a portion of the gate electrode 130.

The body region 110 may be a second conductivity type (e.g., n-type) impurity region, for example. The body region 110 may be a second conductivity type well.

The body region 110 may have a relatively lower doping concentration compared to the source region 120, and, in an example, the doping concentration may be an impurity concentration doped (or injected) to each region.

The body contact region 122 may be adjacent to the source region 120 and formed within the body region 110. The source region 120 may be disposed between the body contact region 122 and the gate electrode 130.

The body contact region 122 may be a high concentration impurity region of a second conductivity type, for example. The body contact region 122 may have a relatively higher doping concentration compared to the body region 110.

A metal silicide film may be formed on the upper surface of the body contact region 122 to reduce the resistance between the body contact region 122 and the contact that applies the body voltage to the body contact region 122.

The drain region 125 may be disposed on the other side of the gate electrode 130. The drain region 125 may be a high concentration impurity region of a first conductivity type, for example.

The drain region 125 may be formed within the substrate 100. Further, unlike the illustration, the drain region 125 may be a raised drain region.

A metal silicide film may be formed on the upper surface of the drain region 125 to reduce the resistance between the drain region 125 and the contact that applies the drain voltage to the drain region 125.

The device isolating region 160 may be disposed between the drain region 125 and the gate electrode 130.

The drift region 115 may be disposed on the other side of the gate electrode 130. The drift region 115 may be formed adjacent to the body region 110.

The drift region 115 may be formed under the drain region 125 to surround the drain region 125.

The drift region 115 may be formed within the substrate 100. The drift region 115 may overlap with a portion of the gate electrode 130.

The drift region 115 may be formed to surround the device isolating region 160 as well as the drain region 125. In other words, the device isolating region 160 may be disposed within the drift region 115.

The drift region 115 may be a first conductivity type (e.g., p-type) impurity region, for example. The drift region 115 may be a first conductivity type well.

The drift region 115 may have a relatively lower doping concentration compared to the source region 120 and the drain region 125.

As shown in FIG. 1, the drift region 115 and the body region 110 are not in contact with each other, but exemplary embodiments are not limited thereto.

The pick-up contact region 145 may be disposed on the other side of the gate electrode 130. The pick-up contact region 145 may be a relatively high concentration impurity region of a second conductivity type, for example.

The pick-up contact region 145 may not be disposed within the drift region 115. The drain region 125 may be disposed between the pick-up contact region 145 and the gate electrode 130.

The pick-up contact region 145 may be formed within the substrate 100. Further, unlike the illustration, the pick-up contact region 145 may be a region including an upper surface raised higher than the upper surface of the substrate 100.

A metal silicide film may be formed on the upper portion of the pick-up contact region 145 to reduce the resistance between the pick-up contact region 145 and the contact that applies the pick-up voltage to the pick-up contact region 145.

A pick-up region 140 may be disposed on the other side of the gate electrode 130. The pick-up region 140 may be formed adjacent to the drift region 115. The drift region 115 may be disposed between the pick-up region 140 and the body region 110.

The pick-up region 140 may be formed under the pick-up contact region 145 to surround the pick-up contact region 145.

The pick-up region 140 may be formed within the substrate 100. The pick-up region 140 may not overlap with the gate electrode 130.

The pick-up region 140 may be a second conductivity type (e.g., n-type) impurity region, for example. The pick-up region 140 may be a second conductivity type well.

The pick-up region 140 may have a relatively lower doping concentration compared to the pick-up contact region 145.

As illustrated in FIG. 1, the drift region 115 and the pick-up region 140 may be in contact with each other, but embodiments of the inventive concept are not limited thereto.

The deep well 150 may be disposed under the body region 110, the pick-up region 140, and the drift region 115. The deep well 150 may be disposed across the pick-up region 140, the body region 110 and the drift region 115.

The deep well 150 may be formed within the substrate 100. The deep well 150 may have a different conductivity type from the substrate 100. The deep well 150 may be a second conductivity type (e.g., n-type) impurity region.

The deep well 150 and the drift region 115 may have the same conductivity type and may not be in contact with each other. However, the deep well 150 and the pick-up region 140 may have the same conductivity type and may be in contact with each other.

The body region 110, the drift region 115, and the pick-up region 140 may be respectively disposed on the deep well 150.

Although FIG. 1 illustrates that the source region 120, the drain region 125, the body contact region 122, and the pick-up contact region 145 may be formed by injecting the impurity into the substrate 100, exemplary embodiments may not be limited thereto.

The source region 120, the drain region 125, the body contact region 122 and the pick-up contact region 145 may be formed by removing a portion of the substrate 100 to form a recess, and then forming an epitaxial pattern on the recess.

The high voltage well 155 may be disposed under the body region 110 and the drift region 115. However, the high voltage well 155 may not be disposed under the pick-up region 140.

The high voltage well 155 may be disposed between the body region 110 and the deep well 150. The body region 110 and the deep well 150 may be isolated from each other by the high voltage well 155.

Further, the high voltage well 155 may be disposed between the drift region 115 and the deep well 150. That is, a portion of the high voltage well 155 may extend between the drift region 115 and the deep well 150.

In FIG. 1, the high voltage well 155 may entirely extend between a region where the drift region 115 and the deep well 150 vertically overlap with each other. That is, a width of the drift region 115 may be substantially same as a width of the vertically overlapping region of the drift region 115 and the high voltage well 155.

In the semiconductor device according to some exemplary embodiments of the inventive concept, the high voltage well 155 may extend across the body region 110 and the drift region 115, but may not extend along the pick-up region 140.

Because the high voltage well 155 may not extend between the pick-up region 140 and the deep well 150, the pick-up region 140 and the deep well 150 may be in contact with each other.

The body region 110 and the drift region 115 may be respectively disposed on the upper portion of the high voltage well 155, but the pick-up region 140 may not be disposed on the upper portion of the high voltage well 155.

The high voltage well 155 may be formed within the substrate 100. The high voltage well 155 may be a first conductivity type (e.g., p-type) well, for example.

Because the high voltage well 155 may be formed more deeply than the pick-up region 140, the drift region 115, and the body region 110, the high voltage well 155 may be the deep well 150.

The high voltage well 155 may be disposed within the deep well 150. However, the high voltage well 155 may not be buried within the deep well 150. That is, the deep well 150 may not be disposed between the high voltage well 155 and the body region 110 and between the high voltage well 155 and the drift region 115.

The high voltage well 155 may be in contact with the drift region 115 and the body region 110. The upper portion of the high voltage well 155 may be in contact with the lower portion of the drift region 115 and the lower portion of the body region 110.

In the semiconductor device according to some exemplary embodiments of the inventive concept, the drain region 125 and the pick-up contact region 145 may be connected with a first voltage (V1) (i.e., a node having a same electrical potential). That is, the drain region 125 and the pick-up contact region 145 may be connected with the node having a same electrical potential.

The deep well 150 may be connected with the first voltage (V1) through the pick-up contact region 145 and the pick-up region 140. That is, the deep well 150 and the drain region 125 may be connected with the first voltage (V1).

As illustrated in FIG. 1, the source region 120 and the body contact region 122 may be connected with a second voltage (V2), which is different from the first voltage (V1).

The voltage connected with the source region 120 may be different from the voltage connected with the body contact region 122.

In the semiconductor device according to some exemplary embodiments of the inventive concept, the source region 120, the drain region 125, the body contact region 122, the body region 110, the drift region 115, the high voltage well 155, the deep well 150, the pick-up contact region 145, and the pick-up region 140 may be impurity regions formed by injecting the impurity into the substrate 100.

In other words, the substrate 100 may include the source region 120, the drain region 125, the body contact region 122, the body region 110, the drift region 115, the high voltage well 155, the deep well 150, the pick-up contact region 145, and the pick-up region 140.

The first conductivity type (e.g., p-type) substrate 100 may include the second conductivity type (e.g., n-type) deep well 150, and the high voltage well 155 on the deep well 150. In other words, the substrate 100, the deep well 150, and the high voltage well 155 may have a stack structure corresponding to a PNP transistor.

Further, the transistor including the gate electrode 130 may be formed on the substrate 100 including a stack structure of PNP transistor. This will be specifically described below with reference to FIGS. 2 and 3.

Figure 2:
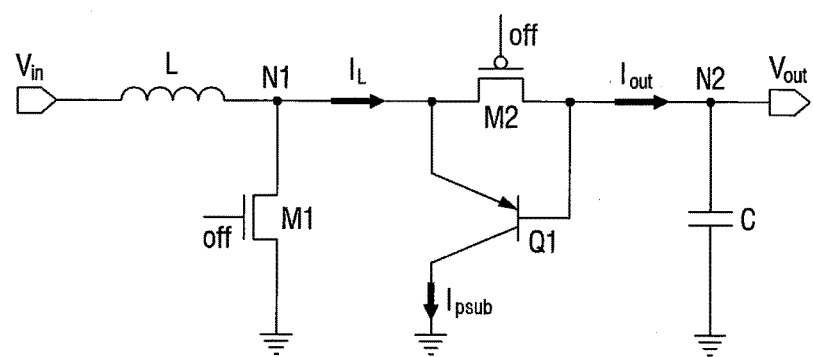
FIG. 2 is a circuit diagram that may include a semiconductor device of FIG. 1 according to some embodiments of the inventive concept.
Figure 3:
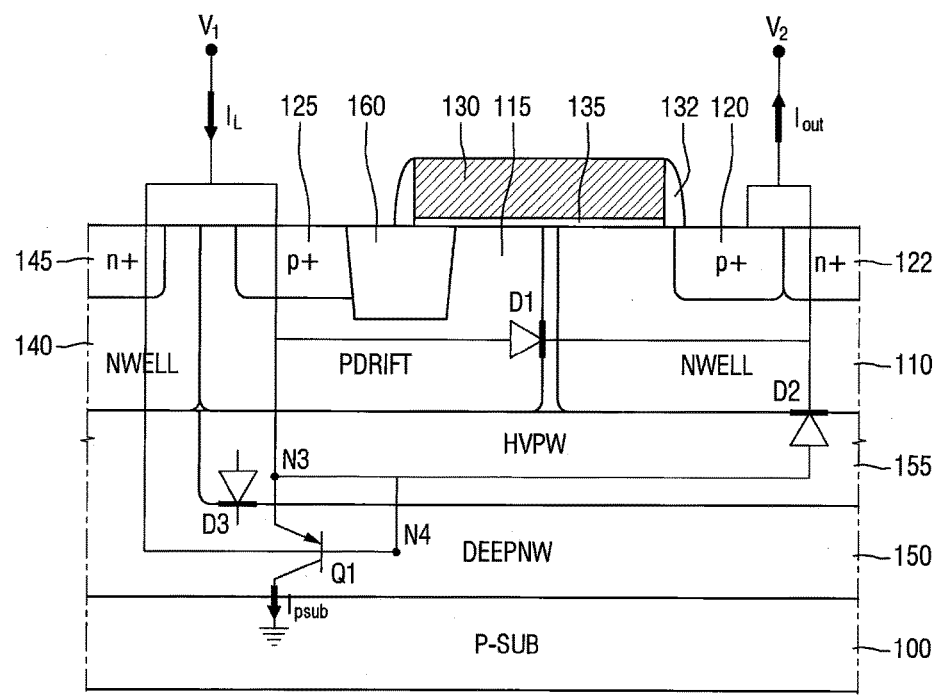
FIG. 3 is a cross-section view of an internal equivalent circuit of the semiconductor device of FIG. 1 according to some embodiments of the inventive concept.

Referring to FIGS. 2 and 3, circuit diagrams of the semiconductor device according to some exemplary embodiments of the inventive concept will be described below.

FIG. 2 partly illustrates a circuit view of a synchronous booster converter in which the semiconductor device according to some exemplary embodiments may be used. Because the circuit view of FIG. 2 is provided for exemplary embodiments, a technical essence of the present disclosure may not be limited thereto.

Referring to FIG. 2, an inductor (L) may be disposed between an input voltage end (Vin) and the first node (N1). Further, an end of the first transistor (M1) and an end of the second transistor (M2) may contact each other at the first node (N1). The first transistor (M1) and the second transistor (M2) may be used as a switching device in a synchronous booster converter, for example.

The other end of the second transistor (M2) may be connected with an output voltage end (Vout). A capacitor (C) that can maintain the constant voltage of the output voltage end (Vout) may contact the second node (N2) placed between the second transistor (M2) and the output voltage end (Vout).

While the second transistor (M2) is being formed on the semiconductor substrate, a parasitic bipolar transistor (Q1) may be included in the circuit view of the synchronous booster converter.

An emitter terminal of the parasitic bipolar transistor (Q1) may be connected with the first node (N1), and a base terminal of the parasitic bipolar transistor (Q1) may be connected with the second node (N2).

For example, when the second transistor (M2) is in an off state and the first transistor (M1) is in on state, the inductor currents ($I_L$) flowing through the inductor (L) may flow through the channel region of the first transistor (M1).

Thereafter, when the first transistor (M1) is turned off, the first transistor (M1) and the second transistor (M2) may simultaneously enter into a dead time section which is an off state. Further, when the first transistor (M1) is turned off and the second transistor (M2) is turned on, the first transistor (M1) and the second transistor (M2) may be similar to the state of being in the dead time section until the second transistor (M2) is in a saturation region.

Because the first transistor (M1) and the second transistor (M2) are in an off state, the inductor currents ($I_L$) may not flow through a channel region of the first transistor (M1) and a channel region of the second transistor (M2).

However, because the inductor (L) has a characteristic of maintaining the inductor current ($I_L$) flowing through the inductor, the inductor (L) may operate like a current source providing the inductor current ($I_L$).

The inductor current ($I_L$) may be divided into the output current (Imo) directed toward the output voltage end (Vout) through the parasitic bipolar transistor (Q1) and the substrate leakage current ($I_{psub}$) flowing toward the semiconductor substrate.

At this time, when the substrate leakage current ($I_{psub}$) flowing toward the semiconductor substrate through a collector of the parasitic bipolar transistor (Q1) increases, the efficiency of the synchronous booster converter circuit may deteriorate. For example, when the input voltage end (Vin)

is connected with the battery, the substrate leakage current ($I_{psub}$) may consume much charge. Thus, the battery life may be shortened.

That is, when the parasitic bipolar transistor (Q1) is turned on and operates, the efficiency of the synchronous booster converter circuit may deteriorate.

Therefore, the substrate leakage current ($I_{psub}$) may be reduced by keeping the parasitic bipolar transistor (Q1) from operating such that the output current ($I_{out}$) directed toward the output voltage end (Vout) through the parasitic bipolar transistor (Q1) may increase. That is, the efficiency of the synchronous booster converter circuit may be enhanced.

In FIGS. 2 and 3, the second transistor (M2) may include the gate electrode 130, the drain region 125, the source region 120 and the body contact region 122.

The drain region 125 of the second transistor (M2) may be connected with the first node (N1). That is, the first voltage (V1 of FIG. 1) connected with the drain region 125 may be a voltage of the first node (N1).

The source region 120 and the body contact region 122 of the second transistor (M2) may be connected with the second node (N2). That is, the second voltage (V2 of FIG. 1) connected with the source region 120 and the body contact region 122 may be a voltage of the second node (N2).

In other words, the first terminal (e.g., drain region 125) of the second transistor (M2) may be connected with a voltage of the first node (N1) (i.e., first voltage (V1) of FIG. 1), and the second terminal (e.g., source region 120 or body contact region 122) of the second transistor (M2) may be connected with a voltage of the second node (N2) (i.e., second voltage (V2) of FIG. 1).

The parasitic bipolar transistor (Q1) may include the deep well 150 (n-type impurity region), the high voltage well 155 (p-type impurity region) on the deep well 150, the drift region 115 (p-type impurity region) on the deep well 150, and the substrate 100 (p-type substrate) of the lower portion of the deep well 150.

The emitter terminal of the parasitic bipolar transistor (Q1) may be a third node (N3) in which the high voltage well 155 and the drift region 115 are positioned. The base terminal of the parasitic bipolar transistor (Q1) may be the deep well 150. Further, a collector terminal of the parasitic bipolar transistor (Q1) may be the substrate 100.

At this time, the substrate leakage current ($I_{psub}$) may flow through the collector of the parasitic bipolar transistor (Q1) toward the substrate 100. The output current ($I_{out}$) directed toward the output voltage end (Vout) may include the current flowing through a first diode (D1) formed between the drift region 115 and the body region 110 and the current flowing through a second diode (D2) formed between the high voltage well 155 and the body region 110.

The deep well 150, which is the base terminal of the parasitic bipolar transistor (Q1), may be connected with the first node (N1) through the pick-up contact region 145 and the pick-up region 140.

Because the pick-up contact region 145 and the pick-up region 140 are, respectively, the second conductivity type impurity regions, the voltage drop by the pick-up contact region 145 and the pick-up region 140 may be relatively small. That is, a voltage of the deep well 150, which is the base terminal of the parasitic bipolar transistor (Q1) may be similar to a voltage of the first node (N1).

Therefore, a voltage difference between the emitter terminal (N3) of the parasitic bipolar transistor (Q1) and the base terminal (N4) of the parasitic bipolar transistor (Q1) may be substantially zero.

When there is no voltage difference between the emitter terminal (N3) of the parasitic bipolar transistor (Q1) and the base terminal (N4) of the parasitic bipolar transistor (Q1), the parasitic bipolar transistor (Q1) may not operate.

Therefore, the substrate leakage current ($I_{psub}$) flowing toward the substrate 100 through the collector of the parasitic bipolar transistor (Q1) may be substantially zero or close to zero.

Thereby, the inductor current ($I_L$) may flow toward the output voltage end (Vout) through the first diode (D1) and the second diode (D2). That is, the inductor current ($I_L$) may be substantially the same as the output current ($I_{out}$).

Additionally, a third diode (D3) may be formed between the drift region 115 and the deep well 150. At this time, a voltage difference between the drift region 115 and the deep well 150 may be substantially zero. That is, because a voltage difference applied to the third diode (D3) is approximately zero, the breakdown characteristics of the second transistor (M2) may be enhanced.

Furthermore, when the drift region 115 and the deep well 150 are not isolated by the high voltage well 155, the source region 120 and the drain region 125 may be electrically connected with each other through the pick-up contact region 145, the pick-up region 140, the deep well 150, and the body region 110.

Therefore, regardless of whether the gate voltage is applied to the gate electrode 130 of the second transistor (M2), the electrical current may flow between the source region 120 and the drain region 125 of the second transistor (M2). That is, the second transistor (M2) may not function as a switching device.

FIGS. 4-7 are cross-section views of a semiconductor device according to some exemplary embodiments of the inventive concept. For convenience of description, differences from the exemplary embodiments described with reference to FIGS. 1 to 3 will be primarily described.

Figure 4:
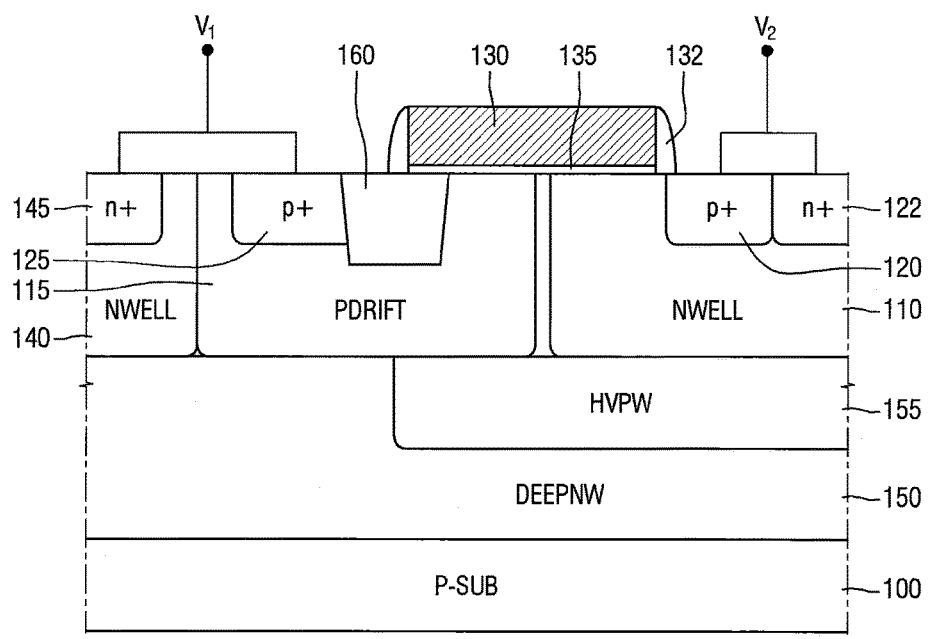
FIG. 4 is a cross-section view of a semiconductor device according to some embodiments of the inventive concept.

Referring to FIG. 4, in the semiconductor device according to some exemplary embodiments of the inventive concept, the high voltage well 155 may vertically overlap with a portion of the drift region 115.

The high voltage well 155 may be disposed in a portion between the drift region 115 and the deep well 150, but may not be disposed in the other portion therebetween. That is, a width of the drift region 115 may be greater than a width of the vertically overlapping region of the drift region 115 and the high voltage well 155.

In other words, a lower surface of the drift region 115 may include a first portion and a second portion. At this time, the high voltage well 155 may be interposed between the first portion of the lower surface of the drift region 115 and the deep well 150, but may not be disposed between the second portion of the lower surface of the drift region 115 and the deep well 150.

Figure 5:
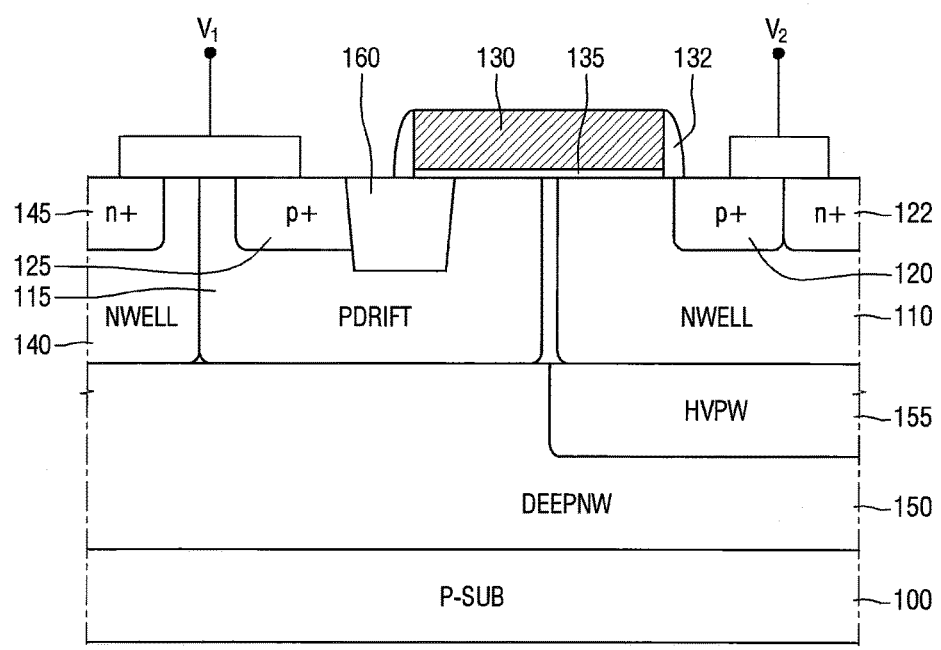
FIG. 5 is a cross-section view of a semiconductor device according to some embodiments of the inventive concept.

Referring to FIG. 5, in the semiconductor device according to some exemplary embodiments of the inventive concept, the high voltage well 155 may be disposed between the body region 110 and the deep well 150, but may not be disposed between the drift region 115 and the deep well 150.

The body region 110 may be in contact with the high voltage well 155, but the drift region 115 may not be in contact with the high voltage well 155. The lower surface of the drift region 115 may be in contact with the deep well 150.

Figure 6:
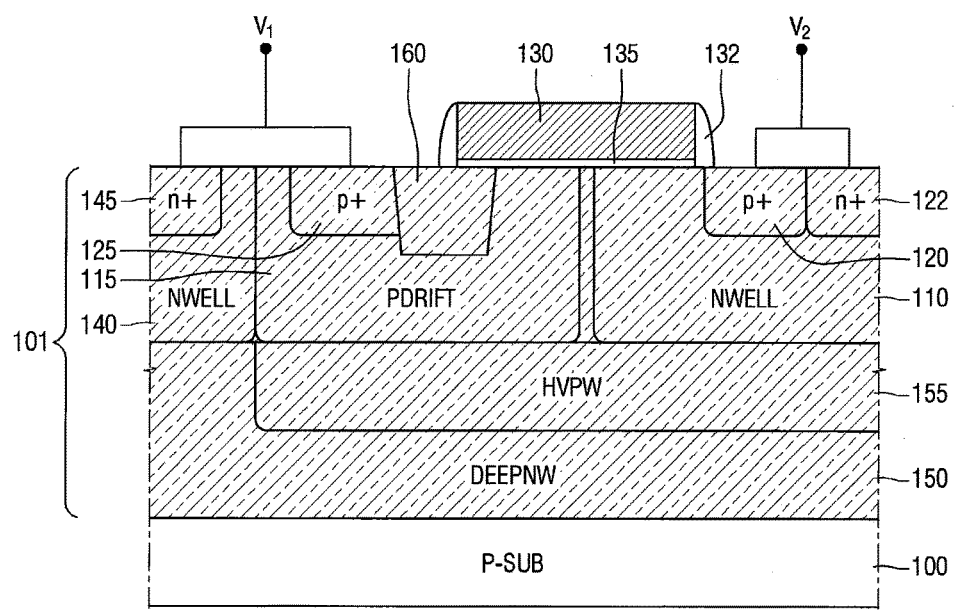
FIG. 6 is a cross-section view of a semiconductor device according to some embodiments of the inventive concept.

Referring to FIG. 6, in the semiconductor device according to some exemplary embodiments of the inventive concept, the deep well 150 and the high voltage well 155 may not be formed within the substrate 100, and may be formed within an epitaxial layer 101 formed on the substrate 100.

That is, after the epitaxial layer 101 is formed on the substrate 100, the source region 120, the drain region 125, the body contact region 122, the body region 110, the drift region 115, the high voltage well 155, the deep well 150, the pick-up contact region 145 and the pick-up region 140 may be formed within the epitaxial layer 101.

The epitaxial layer 101 may include an element semiconductor material, such as silicon or germanium, for example. Further, the epitaxial layer 101 may include a compound semiconductor, such as, for example, IV-IV group compound semiconductor or III-V group compound semiconductor.

For example, in the case of the IV-IV group compound semiconductor, the epitaxial layer 101 may be a binary compound or a ternary compound including at least two or more of carbon (C), silicon (Si), germanium (Ge) and/or tin (Sn), and/or these compounds doped with IV group element.

In the case of the III-V group compound semiconductor, for example, the epitaxial layer 101 may be a binary, ternary or quaternary compound, which is formed by combination of at least one III group element selected from aluminum (Al), gallium (Ga), and indium (In), with one V group element selected from phosphorus (P), arsenic (As) and antimony (Sb).

FIG. 6 illustrates that the epitaxial layer 101 is a single layer, but this is provided for convenience of explanation, and the exemplary embodiments are not limited thereto.

Figure 7:
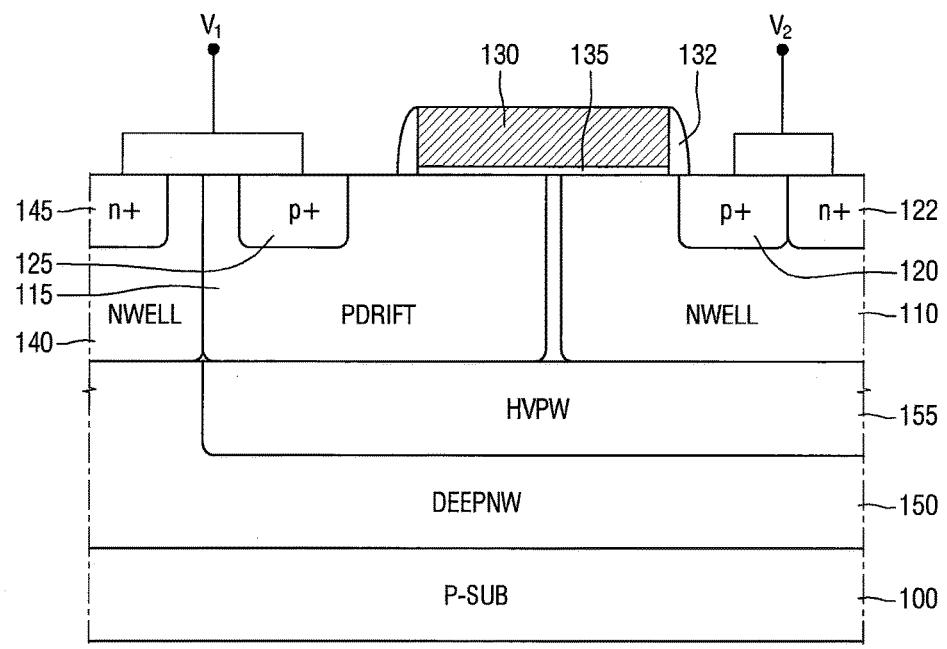
FIG. 7 is a cross-section view of a semiconductor device according to some embodiments of the inventive concept.

Referring to FIG. 7, in the semiconductor device according to some exemplary embodiments of the inventive concept, the device isolating region 160 may not be formed within the drift region 115.

The gate electrode 130 may be formed on a portion of the drift region 115 and a portion of the body region 110.

The drain region 125 may be formed by being isolated from the gate spacer 132 spatially, but embodiments of the inventive concept are not limited thereto.

Figure 8:
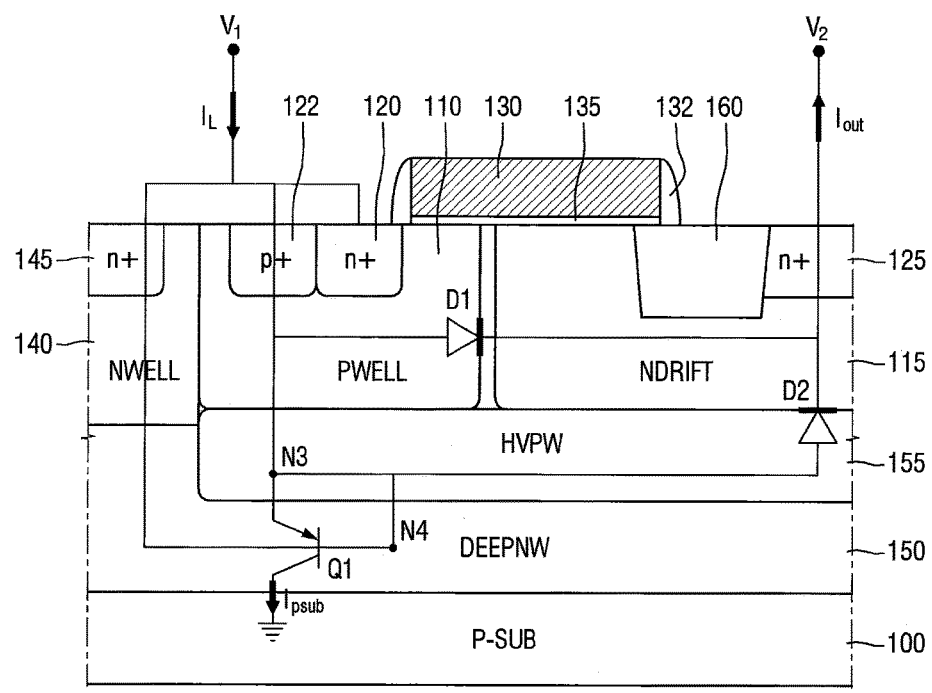
FIG. 8 is a cross-section view of a semiconductor device according to some embodiments of the inventive concept.

FIG. 8 is a cross-section view of a semiconductor device according to some exemplary embodiments of the inventive concept. For convenience of explanation, the following description will be made based on the differences from the description with respect to FIGS. 1 and 3.

For reference, FIG. 8 illustrates an internal equivalent circuit of the semiconductor device.

Referring to FIG. 8, in the semiconductor device according to some exemplary embodiments of the inventive concept, the pick-up contact region 145 may be disposed on one side of the gate electrode 130. The source region 120 may be disposed between the pick-up contact region 145 and the gate electrode 130.

The pick-up region 140 may be disposed on one side of the gate electrode 130. The pick-up region 140 may be formed adjacent to the body region 110. The body region 110 may be disposed between the pick-up region 140 and the drift region 115.

In FIG. 8, the semiconductor device in which the gate electrode 130 is used as a gate may be, for example, a second conductivity type transistor, i.e., an n-type transistor.

Therefore, the source region 120 and the drain region 125 may be, respectively, high concentration impurity regions of a second conductivity type.

Further, the body contact region 122 may be a high concentration impurity region of first conductivity type.

Additionally, the body region 110 may be a first conductivity type (e.g., p-type) impurity region, and the drift region 115 may be a second conductivity type impurity region.

The device isolating region 160 may be formed within a second conductivity type drift region 115.

The high voltage well 155 may be disposed between the drift region 115 and the deep well 150. With the high voltage well 155, the drift region 115 and the deep well 150 may be isolated from each other.

Further, the high voltage well 155 may be disposed between the body region 110 and the deep well 150. That is, a portion of the high voltage well 155 may extend between the body region 110 and the deep well 150.

As illustrated in FIG. 8, the high voltage well 155 may entirely extend between the vertically overlapping region of the body region 110 and the deep well 150. That is, a width of the body region 110 may be substantially the same as a width of the vertically overlapping region of the body region 110 and the high voltage well 155.

In FIG. 8, an impurity concentration of the body region 110, which is the first conductivity type, may be greater than an impurity concentration of the high voltage well 155, which is the first conductivity type.

Further, FIG. 8 illustrates that the upper surface of the high voltage well 155 is higher than the lower surface of the pick-up region 140, but embodiments of the inventive concept are not limited thereto.

In the semiconductor device according to some exemplary embodiments, the source region 120, the body contact region 122, and the pick-up contact region 145 may be connected with the first voltage (V1) (i.e., node having the same electrical potential). That is, the source region 120, the body contact region 122 and the pick-up contact region 145 may be connected with the node having the same electrical potential.

In FIG. 8, the drain region 125 may be connected with the second voltage (V2) different from the first voltage (V1).

The transistor including the gate electrode 130 described in FIG. 8 may be the second transistor (M2) of FIG. 2. FIG. 2 illustrates that the second transistor (M2) is a p-type transistor. However, the second transistor (M2) described below with reference to FIGS. 2 and 8 is assumed to be an n-type transistor.

Referring to FIGS. 2 and 8, the source region 120 and the body contact region 122 of the second transistor (M2) may be connected with the first node (N1). That is, the first voltage (V1) with which the source region 120 and the body contact region 122 are connected may be a voltage of the first node (N1).

The drain region 125 of the second transistor (M2) may be connected with the second node (N2). That is, the second voltage (V2) connected with the drain region 125 may be a voltage of the second node (N2).

In other words, the first terminal of the second transistor (M2) (e.g., body contact region 122) may be connected with the voltage of the first node (N1) (i.e., first voltage (V1)), and the second terminal of the second transistor (M2) (e.g., drain region 125) may be connected with the voltage of the second node (N2) (i.e., second voltage (V2)).

The parasitic bipolar transistor (Q1) may include the deep well 150 (n-type impurity region), the high voltage well 155 (p-type impurity region) on the deep well 150, the body region 110 (p-type impurity region) on the deep well 150, and the substrate 100 (p-type substrate) on the lower portion of the deep well 150.

The emitter terminal of the parasitic bipolar transistor (Q1) may be the third node (N3) where the high voltage well 155 and the body region 110 are positioned. The base terminal of the parasitic bipolar transistor (Q1) may be the deep well 150. Further, a collector terminal of the parasitic bipolar transistor (Q1) may be the substrate 100.

The substrate leakage current ($I_{psub}$) may flow through the collector of the parasitic bipolar transistor (Q1) toward the substrate 100. The output current ($I_{out}$) directed toward the output voltage end (Vout) may include the current flowing through the first diode (D1) formed between the body region 110 and the drift region 115, and the current flowing through the second diode (D2) formed between the high voltage well 155 and the drift region 115.

The deep well 150, which is the base terminal of the parasitic bipolar transistor (Q1), may be connected with the first node (N1) through the pick-up contact region 145 and the pick-up region 140.

Because the pick-up contact region 145 and the pick-up region 140 are, respectively, the second conductivity type impurity regions, the voltage drop by the pick-up contact region 145 and the pick-up region 140 may be relatively small. That is, a voltage of the deep well 150 which is the base terminal of the parasitic bipolar transistor (Q1) may be similar to a voltage of the first node (N1).

Therefore, a voltage difference between the emitter terminal (N3) of the parasitic bipolar transistor (Q1) and the base terminal (N4) of the parasitic bipolar transistor (Q1) may be substantially zero.

When there is no voltage difference between the emitter terminal (N3) of the parasitic bipolar transistor (Q1) and the base terminal (N4) of the parasitic bipolar transistor (Q1), the parasitic bipolar transistor (Q1) may not operate.

Therefore, the substrate leakage current ($I_{psub}$) flowing toward the substrate 100 through the collector of the parasitic bipolar transistor (Q1) may be substantially zero or close to zero.

FIGS. 9-12 are cross-section views of a semiconductor device according to some exemplary embodiments of the inventive concept. For convenience of explanation, differences that are not described above with reference to FIG. 8 will be primarily described below.

Figure 9:
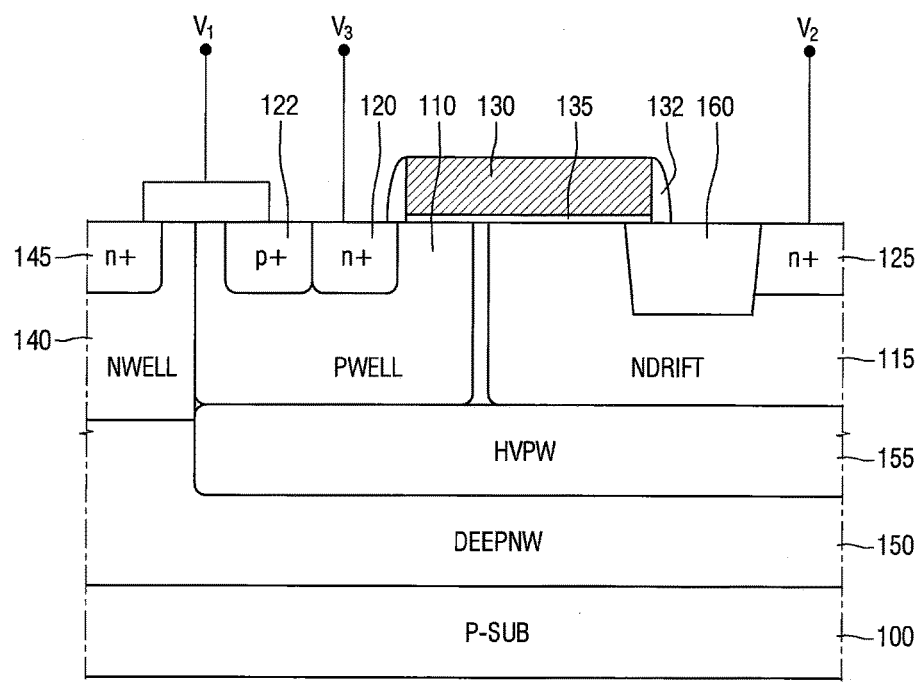
FIG. 9 is a cross-section view of a semiconductor device according to some embodiments of the inventive concept.

Referring to FIG. 9, in the semiconductor device according to some exemplary embodiments of the inventive concept, the body contact region 122 and the pick-up contact region 145 may be connected with the first voltage (V1), and the source region 120 may be connected with the third voltage (V3), which is different from the first voltage (V1) and the second voltage (V2).

That is, the source region 120 may be connected with the third voltage (V3) through a node (not illustrated) other than the first node (N1) of FIG. 2.

Figure 10:
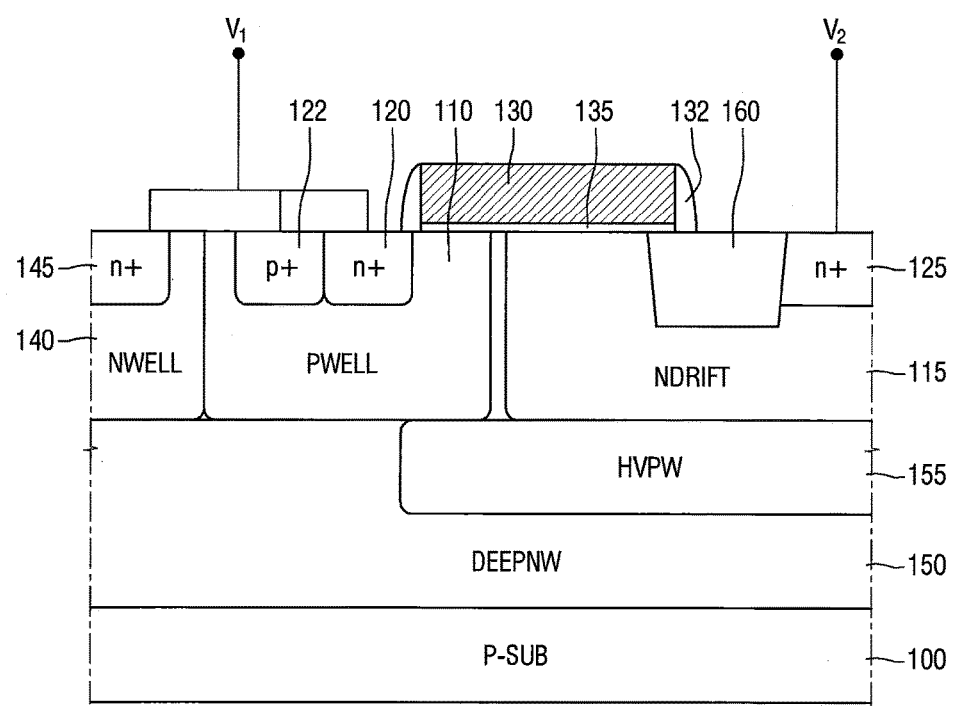
FIG. 10 is a cross-section view of a semiconductor device according to some embodiments of the inventive concept.

Referring to FIG. 10, in the semiconductor device according to some exemplary embodiments of the inventive concept, the high voltage well 155 may vertically overlap with a portion of the body region 110.

The high voltage well 155 may be disposed on a portion between the body region 110 and the deep well 150, but may not be disposed on the other portion between the body region 110 and the deep well 150.

That is, a width of the body region 110 may be greater than a width of the vertically overlapping portions of the body region 110 and the high voltage well 155.

In other words, the lower surface of the body region 110 may include a first portion and a second portion. The high voltage well 155 may be disposed between the first portion of the lower surface of the body region 110 and the deep well 150, but may not be disposed between the second portion of the lower surface of the body region 110 and the deep well 150.

Figure 11:
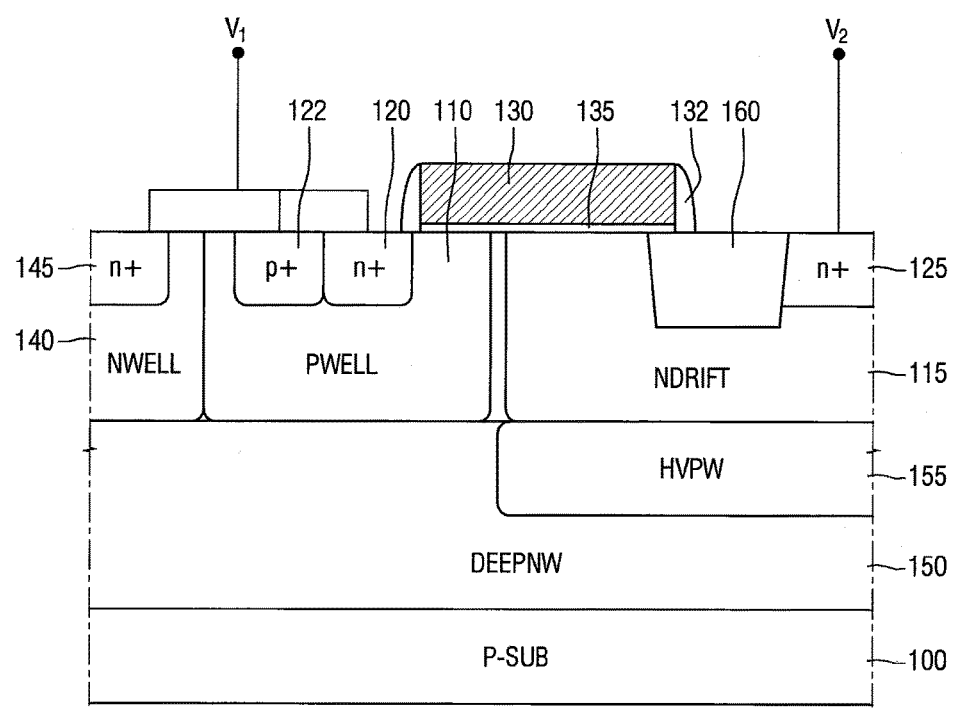
FIG. 11 is a cross-section view of a semiconductor device according to some embodiments of the inventive concept.

Referring to FIG. 11, in the semiconductor device according to some exemplary embodiments of the inventive concept, the high voltage well 155 may be disposed between the drift region 115 and the deep well 150, but may not be disposed between the body region 110 and the deep well 150.

The drift region 115 may be in contact with the high voltage well 155, but the body region 110 may not be in contact with the high voltage well 155. The lower surface of the body region 110 may be in contact with the deep well 150.

Figure 12:
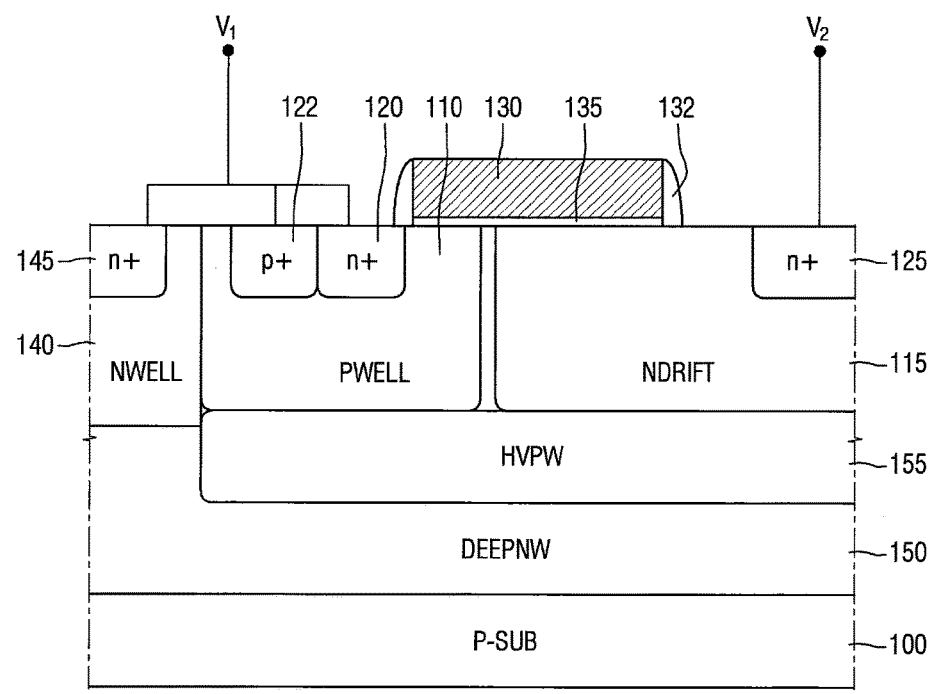
FIG. 12 is a cross-section view of a semiconductor device according to some embodiments of the inventive concept.

Referring to FIG. 12, in the semiconductor device according to some exemplary embodiments, the device isolating region 160 may not be formed within the drift region 115.

The gate electrode 130 may be formed on a portion of the second conductivity type drift region 115 and a portion of the first conductivity type body region 110.

The second conductivity type drain region 125 may be separated spatially from the gate spacer 132, but not limited thereto.

Referring to FIGS. 1 to 12, the semiconductor device according to some exemplary embodiments of the inventive concept is described to use the p-type substrate 100. However, the semiconductor device may be implemented to use an n-type substrate.

When the n-type substrate is used, the deep well 150 may be formed to be the p-type impurity region, the high voltage well 155 may be formed to be the n-type impurity region, and the pick-up region 140 and the pick-up contact region 145 may be respectively formed to be the p-type impurity regions.

Further, through the above description, it will be understood which terminal should be connected with the pick-up contact region among the respective terminals of the n-type transistor and the p-type transistor, when the n-type substrate is used.

Hereinbelow, a method for fabricating a semiconductor device according to some exemplary embodiments of the inventive concept will be described with reference to FIGS. 13 to 16.

FIGS. 13 to 16 are views showing intermediate stages of fabrication that illustrate a method for fabricating a semiconductor device according to some exemplary embodiments of the inventive concept. For reference, the semiconductor device embodiments described with respect to FIG. 1 may be manufactured according to the method of FIGS. 13 to 16.

Figure 13:
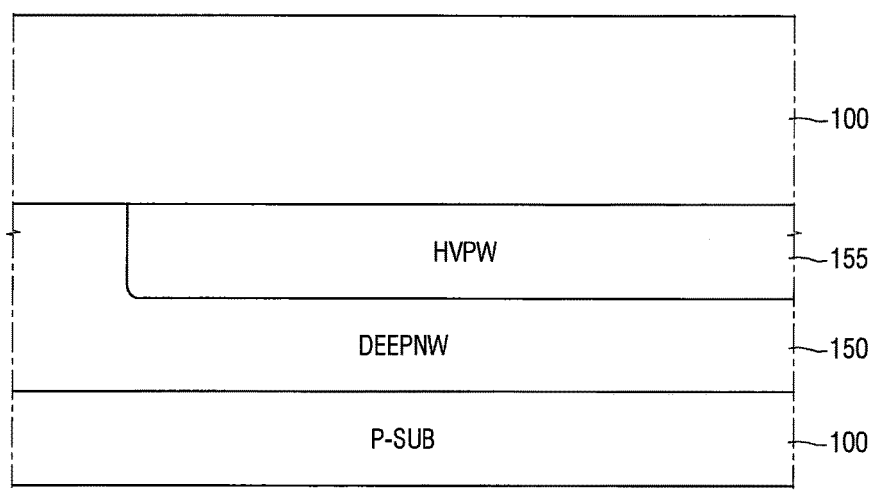
FIGS. 13 to 16 are cross-section views showing intermediate stages of fabrication that illustrate methods for fabri-

Referring to FIG. 13, the n-type deep well 150 may be formed within the p-type substrate 100.

Specifically, a mask pattern defining a region where the deep well 150 is to be formed may be formed on the p-type substrate 100, and the n-type impurity may be injected into the substrate 100. After the n-type impurity is injected, the mask pattern may be removed.

Thereafter, the p-type high voltage well 155 may be formed within the substrate 100. The high voltage well 155 may be, for example, formed by injecting the p-type impurity into the region where the deep well 150 is formed, but embodiments of the inventive concept are not limited thereto.

After the mask pattern defining a region where the high voltage well 155 is to be formed is formed on the p-type substrate 100, the p-type impurity may be injected into the substrate 100. After the p-type impurity is injected, the mask pattern may be removed.

Although the upper surface of the high voltage well 155 and the upper surface of the deep well 150 may be in the same plane, this is provided only for convenience of explanation and the exemplary embodiments are not limited thereto.

Because the high voltage well 155 and the deep well 150 may be formed within the substrate 100, the p-type substrate 100 may remain on the upper surface of the high voltage well 155 and on the deep well 150.

Figure 14:
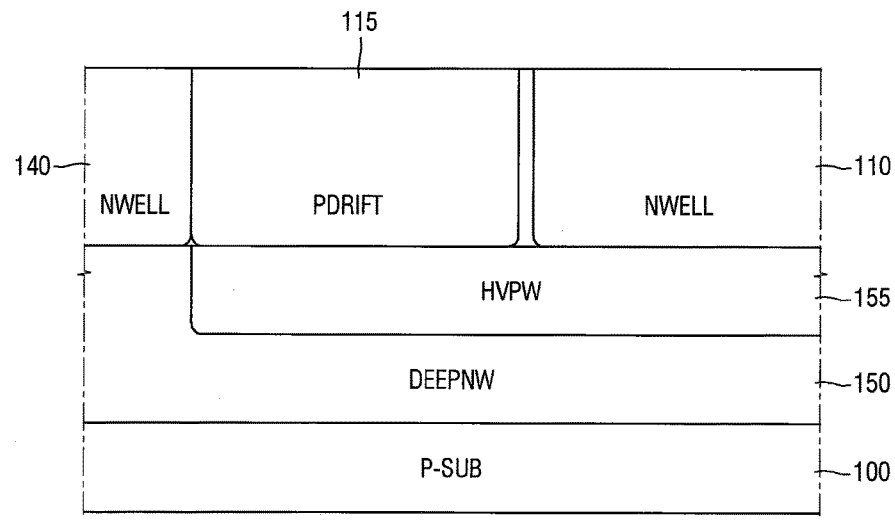

Referring to FIG. 14, the p-type drift region 115 may be formed on the high voltage well 155.

After the mask pattern defining a region where the p-type drift region 115 to be formed is formed, the p-type impurity may be injected into the substrate 100. After the p-type impurity is injected, the mask pattern may be removed.

The n-type body region 110 may be formed on the high voltage well 155, and the n-type pick-up region 140 may be formed on the deep well 150. The body region 110 and the pick-up region 140 may be formed through the same impurity injection process.

After the mask pattern defining a region where the body region 110 and the pick-up region 140 are to be formed is formed, the n-type impurity may be injected into the substrate 100. After the n-type impurity is injected, the mask pattern may be removed.

Any one of the drift region 115 and the body region 110 can be formed first.

Figure 15:
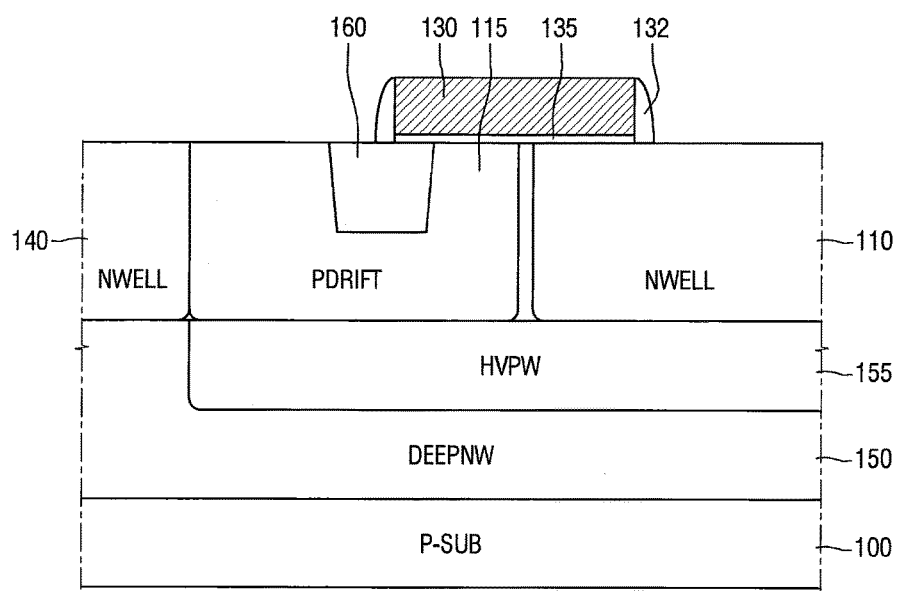

Referring to FIG. 15, the device isolating region 160 may be formed within the drift region 115.

The device isolating region 160 may be formed through STI, but embodiments of the inventive concept are not limited thereto. Accordingly, the device isolating region 160 may be formed through LOCOS in other embodiments of the inventive concept.

The gate insulating film 135 and the gate electrode 130 may be formed across a portion of the drift region 115 and a portion of the body region 110.

The gate electrode 130 overlapping with the drift region 115 may overlap with a portion of the device isolating region 160.

Figure 16:
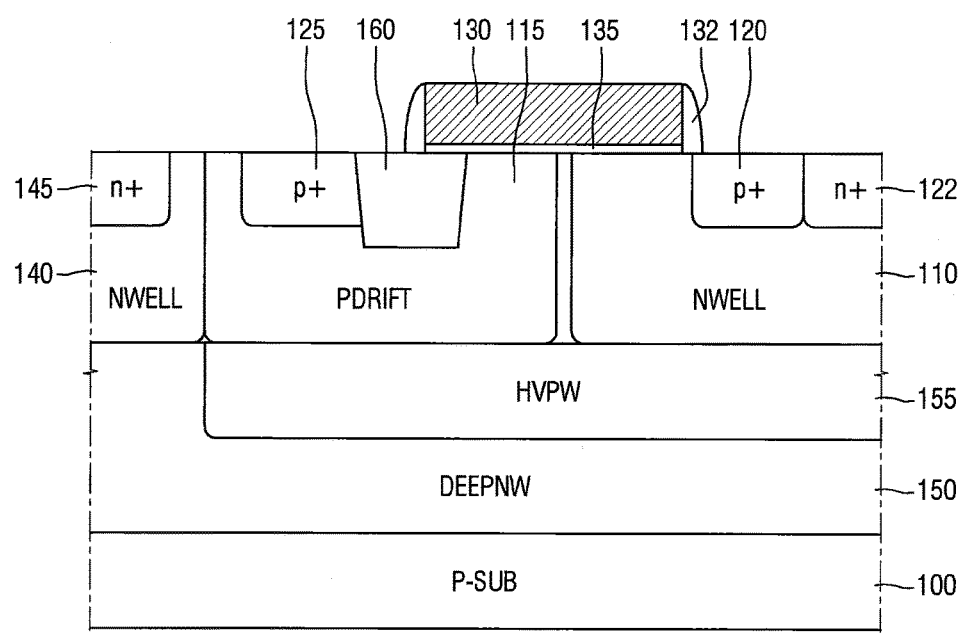

Referring to FIG. 16, the drain region 125 may be formed within the drift region 115, and the source region 120 may be formed within the body region 110.

Further, the pick-up contact region 145 may be formed within the pick-up region 140, and the body contact region 122 may be formed within the body region 110.

Although not illustrated in FIG. 2, a contact connecting the drain region 125 and the pick-up contact region 145 with the first voltage (V1) may be formed, and a contact connecting the source region 120 and the body contact region 122 with the second voltage (V2) may be formed.

In concluding the detailed description, those skilled in the art will appreciate that many variations and modifications can be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device, comprising:
a substrate of a first conductivity type;
a gate electrode on the substrate;
a first high concentration impurity region of the first conductivity type on a first side of the gate electrode;
a first well of the first conductivity type that is under the first high concentration impurity region and surrounds the first high concentration impurity region;
a second well of a second conductivity type that overlaps with a portion of the gate electrode and is adjacent to the first well; and
a first deep well of the second conductivity type that is under the first well and the second well, the first deep well and the first high concentration impurity region being responsive to a first voltage;
a second deep well of the first conductivity type that is between the first well and the first deep well and between the second well and the first deep well;
wherein the second deep well vertically overlaps a first portion of the first well without horizontally overlapping the first well in a cross-sectional view of the semiconductor device, such that a second portion of the first well contacts the first deep well.

2. The semiconductor device of claim 1, further comprising a second high concentration impurity region of the second conductivity type that is on the first side of the gate electrode,
wherein the second high concentration impurity region is not within the first well, and
the first deep well is connected to the first voltage through the second high concentration impurity region.

3. The semiconductor device of claim 1, further comprising a second high concentration impurity region of the first conductivity type and a third high concentration impurity region of the second conductivity type that are on a second side of the gate electrode,
wherein the second high concentration impurity region and the third high concentration impurity region are within the second well.

4. The semiconductor device of claim 3, further comprising a device isolating region that is within the first well between the first high concentration impurity region and the gate electrode,
wherein the gate electrode extends along a portion of an upper surface of the device isolating region.

5. The semiconductor device of claim 3, wherein the first high concentration impurity region and the second high concentration impurity region are p-type regions, and
the first high concentration impurity region is a drain region and the second high concentration impurity region is a source region.

6. The semiconductor device of claim 1, further comprising:
a second high concentration impurity region of the second conductivity type that is within the first well between the gate electrode and the first high concentration impurity region; and
a third high concentration impurity region of the second conductivity type that is on a second side of the gate electrode within the second well.

7. The semiconductor device of claim 6, further comprising a device isolating region that is within the second well between the third high concentration impurity region and the gate electrode,
wherein the gate electrode extends along a portion of an upper surface of the device isolating region.

8. The semiconductor device of claim 6, wherein the second high concentration impurity region and the third high concentration impurity region are n-type regions, and
the second high concentration impurity region is a source region, and the third high concentration impurity region is a drain region.

9. The semiconductor device of claim 6, wherein the second high concentration impurity region is responsive to the first voltage.

* * * * *